United States Patent
Tsujita et al.

(10) Patent No.: US 9,690,201 B2
(45) Date of Patent: Jun. 27, 2017

(54) DRAWING METHOD AND METHOD OF MANUFACTURING ARTICLE

(71) Applicant: CANON KABUSHIKI KAISHA, Tokyo (JP)

(72) Inventors: Kouichirou Tsujita, Utsunomiya (JP); Masato Muraki, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 440 days.

(21) Appl. No.: 13/749,853

(22) Filed: Jan. 25, 2013

(65) Prior Publication Data

US 2013/0196517 A1  Aug. 1, 2013

(30) Foreign Application Priority Data

Jan. 31, 2012 (JP) .................................. 2012-018634

(51) Int. Cl.
*H01L 21/268* (2006.01)
*G03F 7/20* (2006.01)

(52) U.S. Cl.
CPC .............. *G03F 7/20* (2013.01); *G03F 7/203* (2013.01); *H01L 21/268* (2013.01)

(58) Field of Classification Search
None
See application file for complete search history.

(56) References Cited

U.S. PATENT DOCUMENTS

| | | | |
|---|---|---|---|
| 5,438,207 A * | 8/1995 | Itoh et al. | 250/492.23 |
| 5,639,453 A * | 6/1997 | Clark et al. | 424/85.2 |
| 6,014,200 A * | 1/2000 | Sogard et al. | 355/53 |
| 7,446,352 B2 | 11/2008 | Becker et al. | |
| 7,691,549 B1 | 4/2010 | Glasser | |
| 8,309,436 B2 * | 11/2012 | Kurita | 438/471 |
| 2004/0026634 A1 * | 2/2004 | Utsumi et al. | 250/492.23 |

(Continued)

FOREIGN PATENT DOCUMENTS

| JP | 2009529787 A | 8/2009 |
|---|---|---|
| JP | 2009295893 A | 12/2009 |

(Continued)

OTHER PUBLICATIONS

Valery Axelrad et al. "16nm with 193nm Immersion Lithography and Double Exposure" Design for Manufacturability through Design-Process Integration IV, vol. 7641, 764109. pp. 1-6, © 2010 SPIE.

(Continued)

*Primary Examiner* — Seahvosh Nikmanesh
(74) *Attorney, Agent, or Firm* — Rossi, Kimms & McDowell LLP

(57) ABSTRACT

A charged particle beam drawing apparatus draws a plurality of cut patterns on a plurality of first linear patterns arranged to extend in a first direction and align themselves at a predetermined pitch P in a second direction perpendicular to the first direction. The plurality of cut patterns are drawn so that an interval Ai in the second direction between the centers of each pair of cut patterns adjacent to each other in the second direction (i is a number which specifies the pair) satisfies a relation:

$$Ai = m_1 X \ (m_1 = 1, 2, 3, \ldots)$$

where X is a dimension defined by the pitch P.

8 Claims, 12 Drawing Sheets

(56) References Cited

U.S. PATENT DOCUMENTS

2004/0185354 A1* 9/2004 Masuda et al. ................. 430/30
2012/0219914 A1* 8/2012 Muraki ......................... 430/296

FOREIGN PATENT DOCUMENTS

| JP | 2011258842 A | 12/2011 |
| KR | 1020100076317 A | 7/2010 |
| KR | 1020110112723 A | 10/2011 |
| KR | 1020110121467 A | 11/2011 |

OTHER PUBLICATIONS

Office Action issued in CN201310031183.9 mailed Sep. 2, 2014. English translation provided.
Office Action issued in Japanese Application No. JP2012-018634 dated Jun. 27, 2016.

* cited by examiner

F I G. 8

FIXED LUMINANCE = 2.5E5 [A/sr/cm$^2$]

|  | CONVENTIONAL LAYOUT (PRIOR ART) | DEDICATED TO CUT PATTERNS IN 1D LAYOUT (FIRST EMBODIMENT OF PRESENT INVENTION) | |
| --- | --- | --- | --- |
| NUMBER OF OBJECTIVE LENSES | 12960 | 12960 | 12960 |
| NUMBER OF ELECTRON BEAMS OF SUB-ARRAYS | 36 | 16 | 36 |
| TOTAL NUMBER OF ELECTRON BEAMS | 466560 | 207360 | 466560 |
| GX[nm] | 2.5 | 2.5 | 2.5 |
| GY[nm] | 2.5 | 5.0 | 5.0 |
| THROUGHPUT[wafer/hr] | 22.1 | 23.5 | 53.0 |
| REQUIRED TRANSFER RATE [Gbps] | 6.93 | 3.69 | 8.31 |

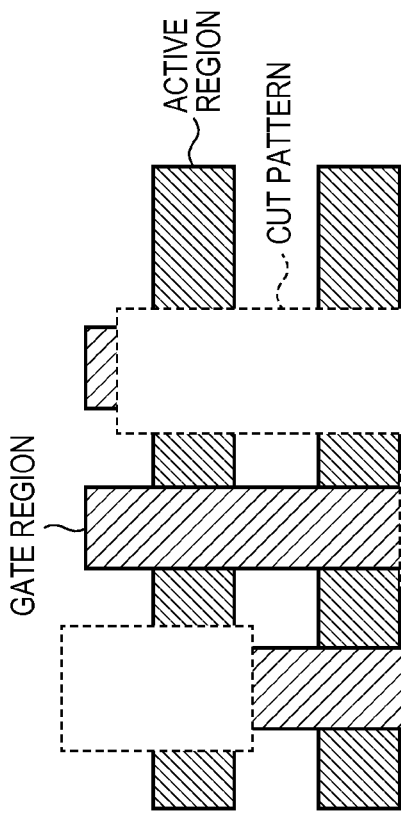
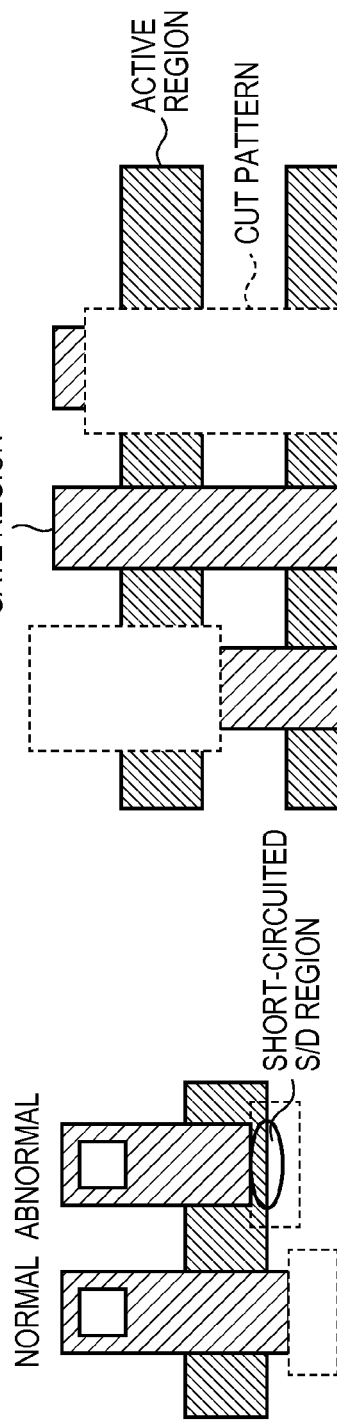
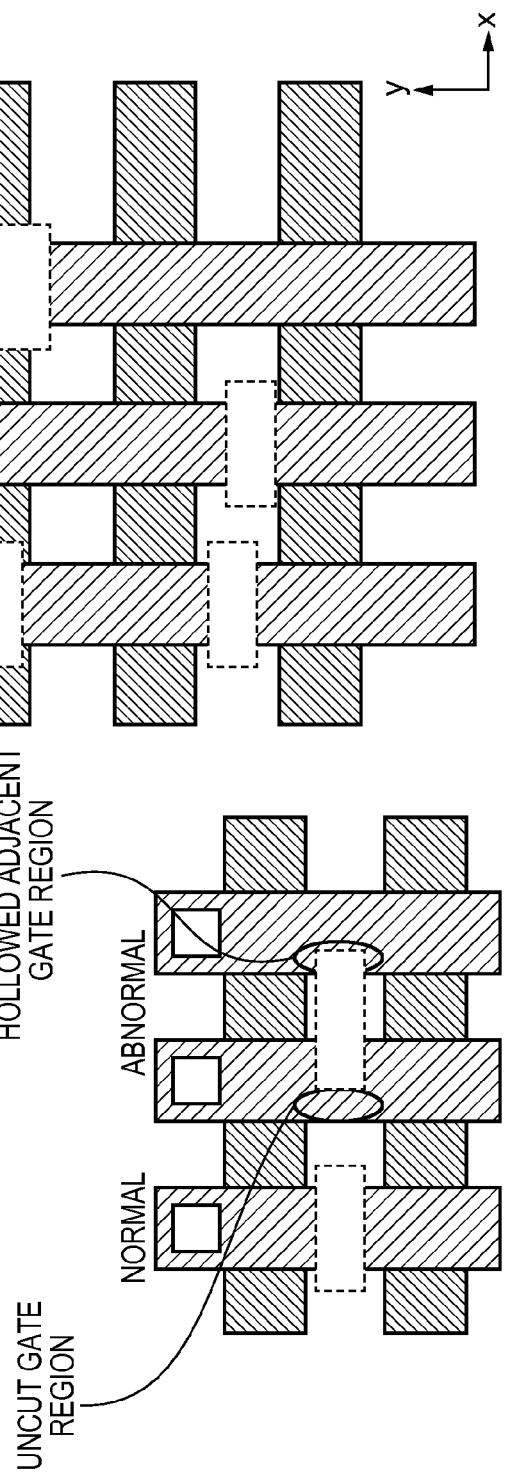

DRAWING METHOD AND METHOD OF MANUFACTURING ARTICLE

BACKGROUND OF THE INVENTION

Field of the Invention

The present invention relates to a drawing method which uses a charged particle beam, and a method of manufacturing an article.

Description of the Related Art

With an increase in packing density of semiconductor integrated circuits, and downsizing of semiconductor devices, it is desired to accelerate the development of the lithography technology. When the minimum pattern size has come close to the wavelength of a light source used for exposure in response to the progress of the photolithography technology, unintended light interactions occur between adjacent patterns. However, while the wavelength of a light source used in the photolithography process remains 193 nm, the minimum pattern size has come close to 22 nm these days. The reliability of the lithography process degrades as the difference between the minimum pattern size and the wavelength of light used in the photolithography process increases.

Light beams from respective patterns on a mask used in photolithography generate interference fringes upon mutual interactions. Due to factors associated with interference fringes generated by adjacent patterns, an unintended pattern may be formed on a wafer by chance, or a required pattern may be removed by accident. In either case, a pattern different from a desired pattern may be formed by exposure, leading to a device breakdown. A correction method such as optical proximity effect correction (OPC) is intended to predict the influence of adjacent patterns on each other, and correct a mask so as to form a desired pattern by exposure. However, as the minimum pattern becomes finer, light interactions become more complex, and their prediction quality degrades in optical proximity effect correction along with this trend.

As a method of solving the above-mentioned problem, a device design rule stipulating a pattern that has a constant width and extends in a limited direction (to be referred to as a 1D layout hereinafter) has been proposed in Proc. of SPIE, Vol. 7641, 764109-1. A practical manufacturing method will be described with reference to FIG. 10. FIG. 10 shows a photolithography process for a 22-nm generation SRAM gate cell using an exposure apparatus equipped with a light source having a wavelength of 193 nm, and an immersion optical system. Steps in this process will be described below.

[Step 1] A line-and-space pattern having a half pitch of 44 nm is formed by exposure using the exposure apparatus.

[Step 2] After the pattern formed by exposure is directly processed, or the underlayer is processed, a film is isotropically formed on the entire surface, and anisotropic etching is performed to form a hard mask having a line-and-space pattern with a half pitch of 22 nm while leaving the side wall, that is, the contour of the pattern intact. In step 2, a double patterning technique which uses a side wall is employed.

[Step 3] A resist is applied onto the hard mask, and cut hole patterns are formed on it by exposure.

[Step 4] The hole patterns formed by exposure are chemically treated to shrink them.

[Step 5] Anisotropic etching is performed again to form a hard mask having a desired gate cell pattern.

The shape of a 1D layout will be described with reference to FIG. 9C. FIG. 9C shows isolation regions and gate regions. The gate regions are formed on the isolation regions. A one-dimensional (1D) line-and-space pattern (L/S) is formed in each isolation region to extend in the X-direction, while a one-dimensional (1D) line-and-space pattern (L/S) is formed in each gate region to extend in the Y-direction. In this case, the gate regions will be described upon defining the isolation regions as an underlayer. To form various transistors, it is necessary to cut the gate regions using cut patterns. This requires the condition in which entrance of the end portions of the gate regions in the Y-direction, which are cut using the cut patterns, into active regions is prevented in accordance with the size accuracy and overlay accuracy. When this entrance into active regions occurs, a source/drain (S/D) region to be isolated between the right and left gates short-circuits, as shown in FIG. 9A. In the X-direction, the cut patterns must cover the cut portions of the gate regions as a whole, and must not come into contact with adjacent gate regions, as shown in FIG. 9B. Note that adjacent cut patterns may be connected to each other. In this manner, cut patterns need to neither be arranged symmetrically with respect to the pattern formed in the underlayer, nor have symmetry with each other. As long as the above-mentioned condition is satisfied, the arrangement has a given degree of freedom and need not have a given regularity.

Even when an exposure apparatus including a light source with a wavelength of 193 nm, and an immersion optical system is employed, the double patterning technique must be used to form a line-and-space pattern having a half pitch of 22 nm, so it is difficult to form cut hole patterns by exposure as well. This makes it necessary to add a step of shrinking the formed pattern, as in step 4. As a result, the numbers of masks and steps increase, so the throughput of the photolithography process lowers, leading to a rise in cost and degradation in reliability.

SUMMARY OF THE INVENTION

The present invention provides a drawing method which improves the throughput.

The present invention in its one aspect provides a method of drawing, using a charged particle beam drawing apparatus, a plurality of cut patterns on a plurality of first linear patterns arranged to extend in a first direction and align themselves at a predetermined pitch P in a second direction perpendicular to the first direction, wherein the plurality of cut patterns are drawn so that an interval Ai in the second direction between the centers of each pair of cut patterns adjacent to each other in the second direction (i is a number which specifies the pair) satisfies a relation:

$$Ai = m_i X \ (m_i = 1, 2, 3, \ldots)$$

where X is a dimension defined by the pitch P.

Further features of the present invention will become apparent from the following description of exemplary embodiments with reference to the attached drawings.

BRIEF DESCRIPTION OF THE DRAWINGS

FIG. 8 is a table showing the drawing performances of this embodiment and conventional technique;

FIGS. 9A to 9C are views showing 1D layouts and the layout of cut patterns according to the conventional technique;

DESCRIPTION OF THE EMBODIMENTS

Figure 1:
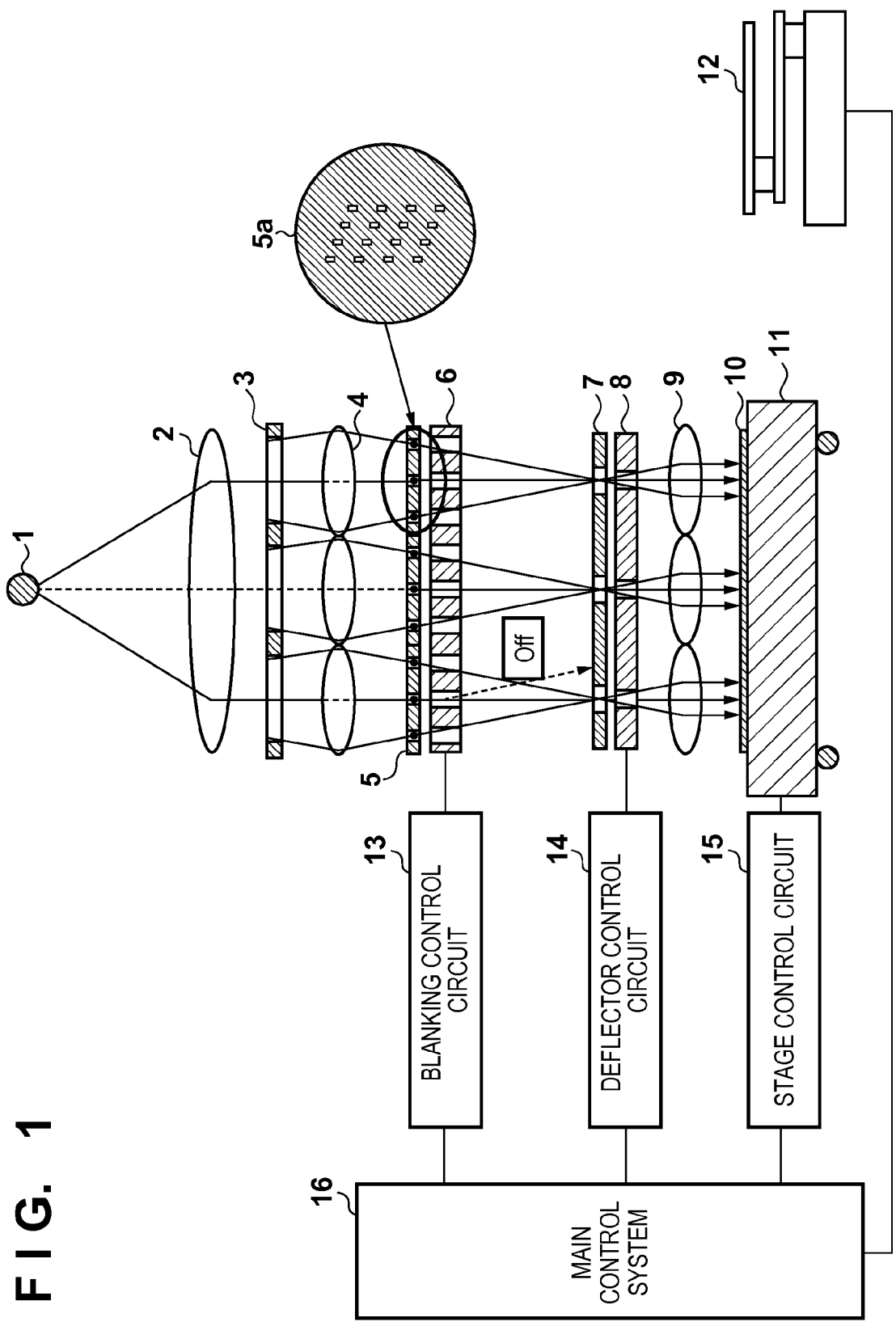
FIG. 1 is a view showing a charged particle beam drawing apparatus.

Embodiments of the present invention will be described in detail below with reference to the accompanying drawings. In principle, the same reference numerals denote the same members throughout the drawings for explaining these embodiments, and a repetitive description thereof will not be given.

First Embodiment

FIG. 1 is a schematic view showing the main part of a charged particle beam drawing apparatus according to the present invention. As an electron source 1, a so-called thermal electron source such as $LaB_6$ or BaO/W (dispenser cathode) is used. A collimator lens 2 is an electrostatic lens which converges an electron beam using an electric field. An electron beam emitted by the electron source 1 is converted into a nearly collimated electron beam by the collimator lens 2. An aperture array 3 includes apertures formed in a two-dimensional arrangement. A condenser lens array 4 is formed by two-dimensionally arranging electrostatic condenser lenses having the same optical power. A pattern aperture array 5 is formed by arranging sub-arrays, in which pattern apertures defining the shapes of electron beams are arranged in correspondence with condenser lenses. 5a is an enlarged view of the sub-arrays when viewed from the upstream side.

The nearly collimated electron beam from the collimator lens 2 is split into a plurality of electron beams by the aperture array 3. Each split electron beam illuminates the corresponding sub-array of the pattern aperture array 5 via the corresponding condenser lens of the condenser lens array 4. The aperture array 3 serves to define the illumination range. A blanker array 6 is formed by arranging electrostatic blankers capable of being driven individually in correspondence with condenser lenses. A blanking aperture array 7 is formed by arranging blanking apertures each having one opening in correspondence with condenser lenses. A deflector array 8 is formed by arranging deflectors which deflect the electron beams in arbitrary directions in correspondence with condenser lenses. An objective lens array 9 is formed by arranging electrostatic objective lenses in correspondence with condenser lenses.

The electron beams from the sub-arrays of the pattern aperture array 5 illuminated with them are reduced to one-hundredth and projected onto a wafer (substrate) 10 via the corresponding blankers, blanking apertures, deflectors, and objective lenses. In other words, the pattern apertures on the sub-arrays are set on the object plane, and the wafer 10 is set on the image plane. The electron beams from the sub-arrays of the pattern aperture array 5 illuminated with them are controlled to pass through the blanking apertures by turning on or off the corresponding blankers, and are also controlled to strike the wafer 10 in accordance with the blanker ON/OFF timing. At the same time, those electron beams are scanned on the wafer 10 by being deflected in the same amount by the deflector array 8.

The electron source 1 forms images on the blanking apertures via the collimator lens 2 and condenser lenses so that these images have a size larger than that of the openings of the blanking apertures. Hence, the semi-angles of the electron beams on the wafer 10 are defined by the openings of the blanking apertures. The openings of the blanking apertures are set at the front focal positions of the corresponding objective lenses. Therefore, the principal rays of the electron beams from the plurality of pattern apertures of the sub-arrays perpendicularly strike the wafer 10. For this reason, the change in position of each electron beam is very small even when the wafer 10 ascends or descends.

A stage 11 can move in the X- and Y-directions perpendicular to the optical axis as the wafer 10 is mounted on it. An electrostatic chuck and a semiconductor detector (neither is shown) are set on the stage 11. The electrostatic chuck tightly fixes the wafer 10. The semiconductor detector has an aperture pattern on the electron beam incident side so as to measure the position of each electron beam. A robot transport device 12 transports and loads the wafer 10 onto the stage 11.

A blanking control circuit 13 individually controls a plurality of blankers which constitute the blanker array 6. A deflector control circuit 14 controls a plurality of deflectors which constitute the deflector array 8 in accordance with a common signal. A stage control circuit 15 controls driving of the stage 11 in cooperation with a laser interferometer (not shown) which detects the position of the stage 11. A main control system 16 controls the plurality of control circuits 13 to 15 to control the overall multi-charged particle beam drawing apparatus.

Figure 2:
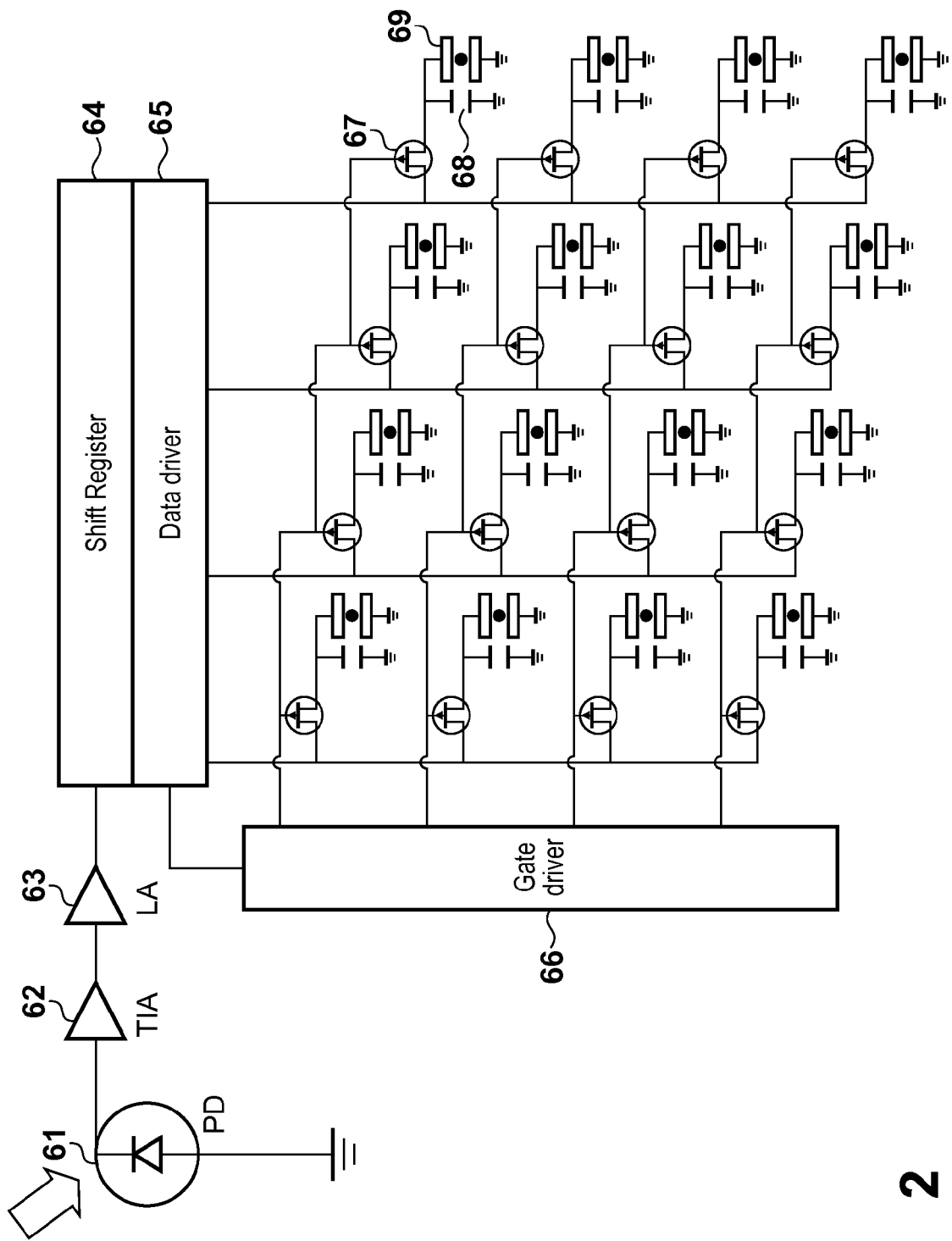
FIG. 2 is a circuit diagram showing the internal circuit of a blanker array.

FIG. 2 is a detailed view showing the internal circuit of the blanker array 6. A control signal is supplied to the blanker array 6 via an optical fiber for optical communication from the blanking control circuit 13. The control signal controls a blanker corresponding to one objective lens of the blanker array 6 for each fiber. That is, the control signal controls blankers which control ON/OFF of the electron beams from a plurality of pattern apertures in one sub-array for each fiber. The control signal is received by a photodiode 61 from the optical fiber for optical communication as an optical signal, is converted from a current signal into a voltage signal by a transfer impedance amplifier 62, and undergoes amplitude adjustment by a limiting amplifier 63. The signal is input to a shift register 64 and converted from a serial signal into a parallel signal.

FETs 67 are arranged at the intersection points between horizontally running gate electrode wires and vertically running source electrode wires, and two bus lines are connected to the gate and source, respectively, of each FET 67. Each FET 67 has its drain side connected to two capacitive elements: a blanker electrode 69 and a capacitor 68, the opposite side of each of which serves as a common electrode. A voltage applied to a gate electrode wire turns on all FETS 67 on one row connected to it, so currents flow between their sources and drains. The voltage applied to each source electrode wire at that time is applied to the blanker electrode 69, and a charge corresponding to the voltage is stored in the capacitor 68. After the charging operation of one row via the gate electrode wire ends, the voltage application sequence shifts to the next row, and the FETs 67 on the first row are turned off upon losing their gate voltages. While the blanker electrodes 69 on the first row lose their voltages from the source electrode wires, they can practically keep the required voltages during the period corresponding to one frame until the next gate electrode wire is selected, using the charges stored in the capacitors 68. In the active matrix driving scheme which uses the FETs 67 as switches in this way, voltages can be simultaneously applied to a large number of FETs 67 by the gate electrode wires, so a small number of lines suffice to cope with an increase in number of blanker electrodes.

Referring to FIG. 2, blankers are arranged in a 4×4 array. A parallel signal from the shift register 64 is input to a data driver 65 to apply a voltage to the source electrode of the FET 67, and all FETs 67 on one row are turned on via a gate driver 66. Upon this operation, blankers on one row are controlled, and parallel signals from the shift register 64 are sequentially input to the data driver 65. Subsequently, all FETs 67 on the next row are turned on via the gate driver 66, thereby controlling the blankers on the 4×4 array.

Figure 3:
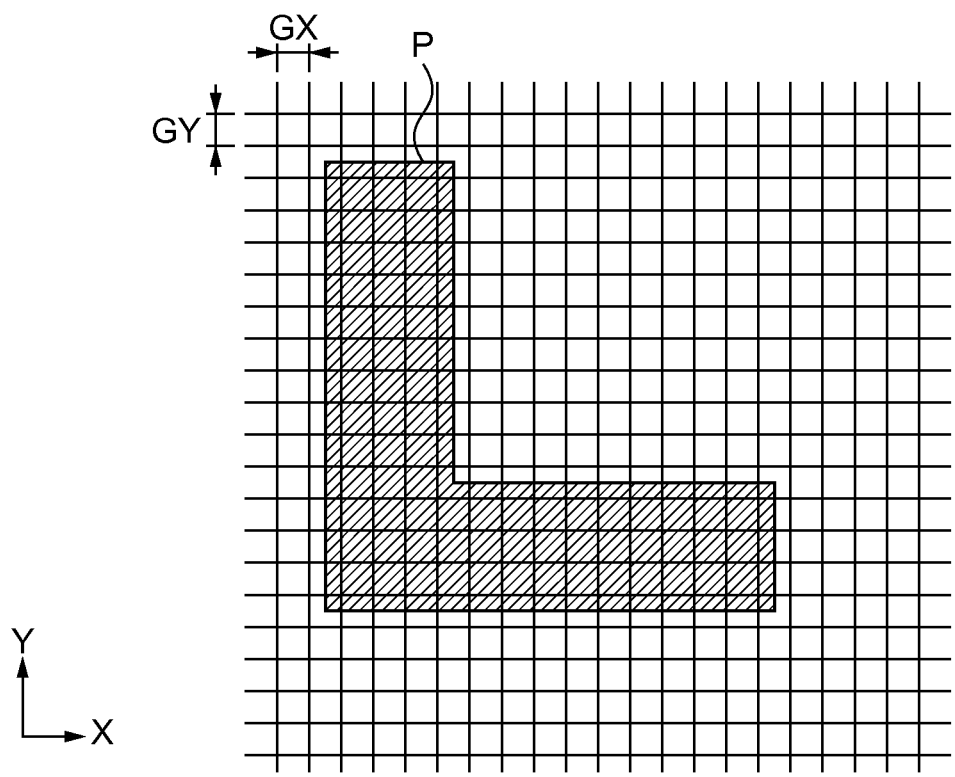
FIG. 3 is a view showing a drawing pattern.

A basic drawing method according to the present invention will be described with reference to FIG. 3. ON/OFF of the irradiation of the wafer 10 with the electron beam is controlled in accordance with a drawing pattern P while it is scanned on a scanning grid on the wafer 10, which is determined by the deflector array 8 and stage 11, thereby drawing a pattern on the wafer 10. The scanning grid means herein a grid formed to have a pitch GX in the X-direction and a pitch GY in the Y-direction, and undergoes ON/OFF control of the irradiation with the electron beam at the intersection points between vertical and horizontal lines, as shown in FIG. 3. This drawing method adopts the so-called raster scanning scheme.

Figure 4:
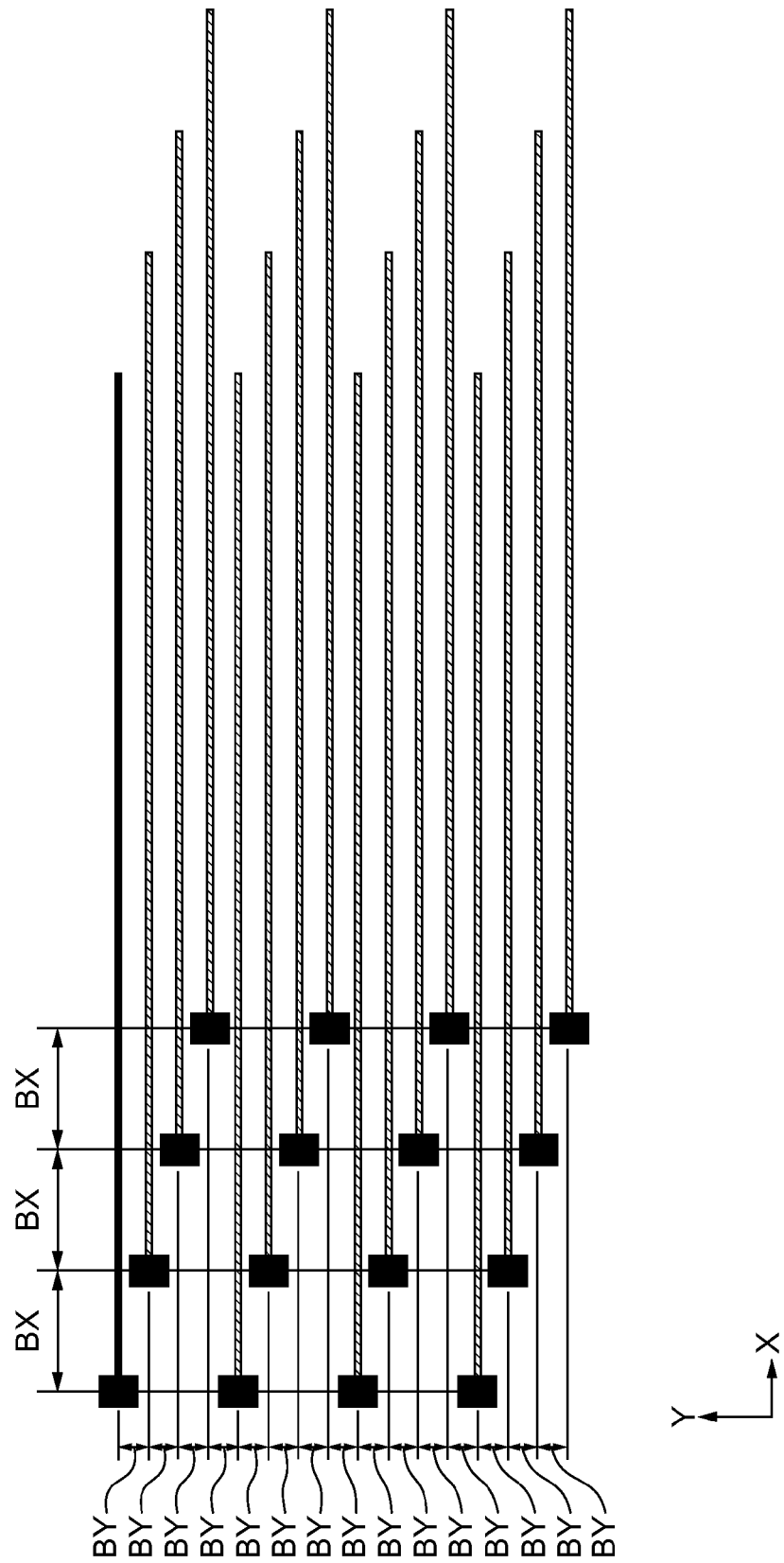
FIG. 4 is a view for explaining the trace of scanning of each electron beam.

The pattern apertures of the sub-arrays are projected onto the wafer 10 at a pitch BX in the X-direction and a pitch BY in the Y-direction, as shown in FIG. 4. The pattern apertures have a size of PX in the X-direction and PY in the Y-direction on the wafer 10. Because the pattern apertures are reduced to one-hundredth and projected onto the wafer 10, the sizes of the actual pattern apertures are 100 times those of their projected images. The pattern aperture images (electron beams) are deflected and scanned in the X-direction by the deflector array 8. At this time, the stage 11 continuously moves in the Y-direction. Hence, each electron beam is deflected in the Y-direction by the deflector array 8 to follow the movement of the stage 11 so that this electron beam stands still in the Y-direction on the wafer 10.

Figure 5:
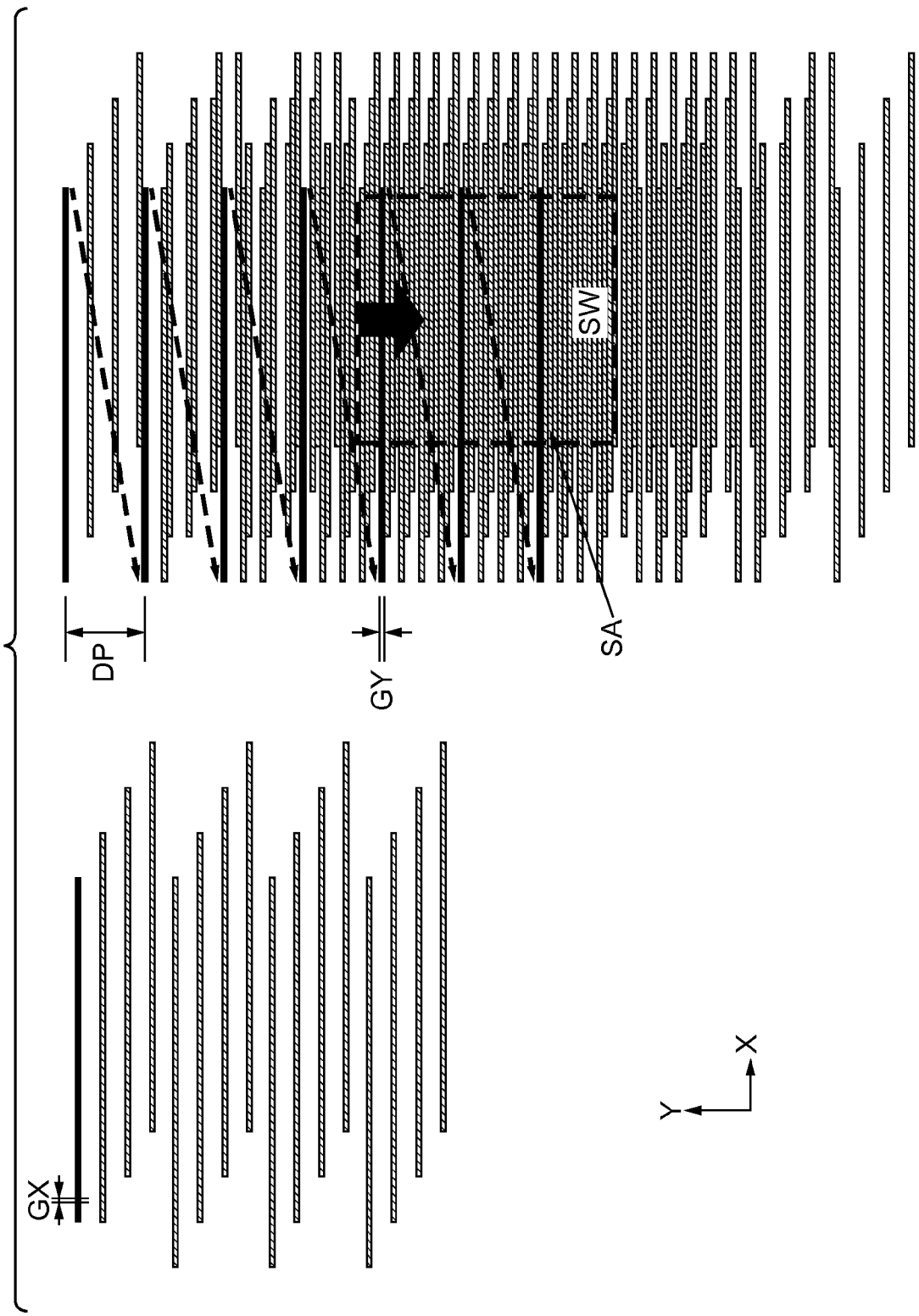
FIG. 5 is a view showing the trace of scanning of each electron beam.

FIG. 5 shows the trace of scanning of each electron beam. The left part of FIG. 5 shows the trace of scanning of each electron beam of the sub-array in the X-direction. The irradiation of each electron beam is controlled at the grid pitch GX. Note that the trace of the uppermost electron beam is indicated by a solid portion, for the sake of simplicity. The right part of FIG. 5 shows the trace of sequential scanning of each electron beam upon flyback at a deflection width DP, as indicated by broken arrows, after scanning of this electron beam in the X-direction. Upon sequential flyback, a stripe drawing region SA with a stripe width SW is filled at the grid pitch GY within a bold line frame shown in FIG. 5. That is, drawing can be performed by continuously moving the stage 11 at a constant speed. Letting N×N be the number of electron beams of the sub-arrays, the above-mentioned operation must satisfy conditions:

$$N^2 = K \times L + 1 \quad (K \text{ and } L \text{ are natural numbers})$$

$$BY = GY \times K$$

$$DP = N^2 \times GY$$

Figure 6:
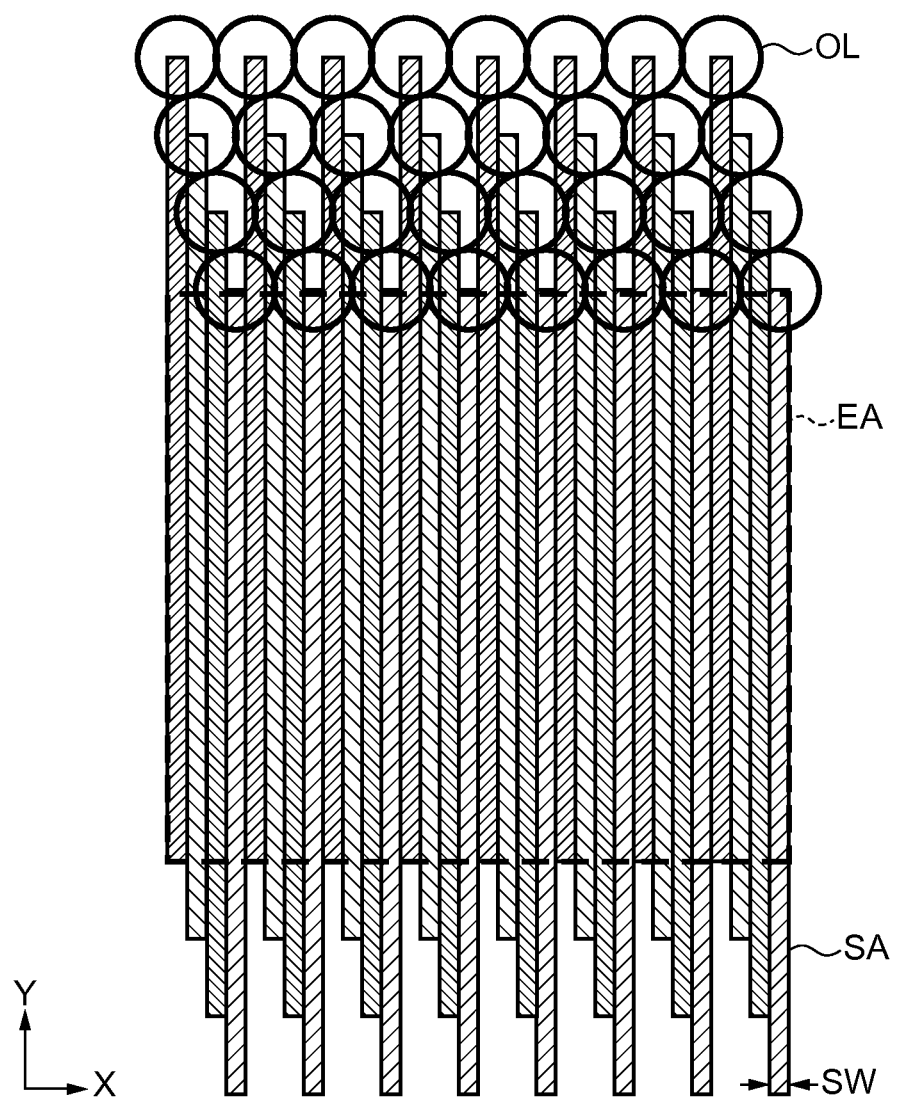
FIG. 6 is a view for explaining the positional relationship between drawing stripe drawing regions.

In this embodiment, N=4, K=5, GY=5 nm, BY=25 nm, DP=80 nm, and SW=2 μm. Note that the stripe width SW is always smaller than the deflection width of each electron beam, so N×BY>BX is set as long as the pitch between the blanking electrodes fall within a manufacturing tolerance. FIG. 6 is a view for explaining the positional relationship between drawing stripe drawing regions SA for each sub-array (or each objective lens).

The objective lens array 9 is formed by one-dimensionally arranging objective lenses on 72 rows, that is, one-dimensionally arranging objective lenses at a pitch of 144 μm in the X-direction while objective lenses on the next row are shifted by 2 μm in the X-direction, as shown in FIG. 6, so that drawing stripe drawing regions SA are adjacent to each other. As a result, drawing can be performed in an exposure region EA on the wafer 10 by continuously moving the stage 11 in the Y-direction. In this embodiment, the X- and Y-axes of the apparatus must coincide with those of the pattern to be drawn on the wafer 10. For this reason, the robot transport device 12 loads the wafer 10 onto the stage 11 so that the X- and Y-directions of the pattern to be formed on the wafer 10 coincide with those of the charged particle beam drawing apparatus.

Figure 7:
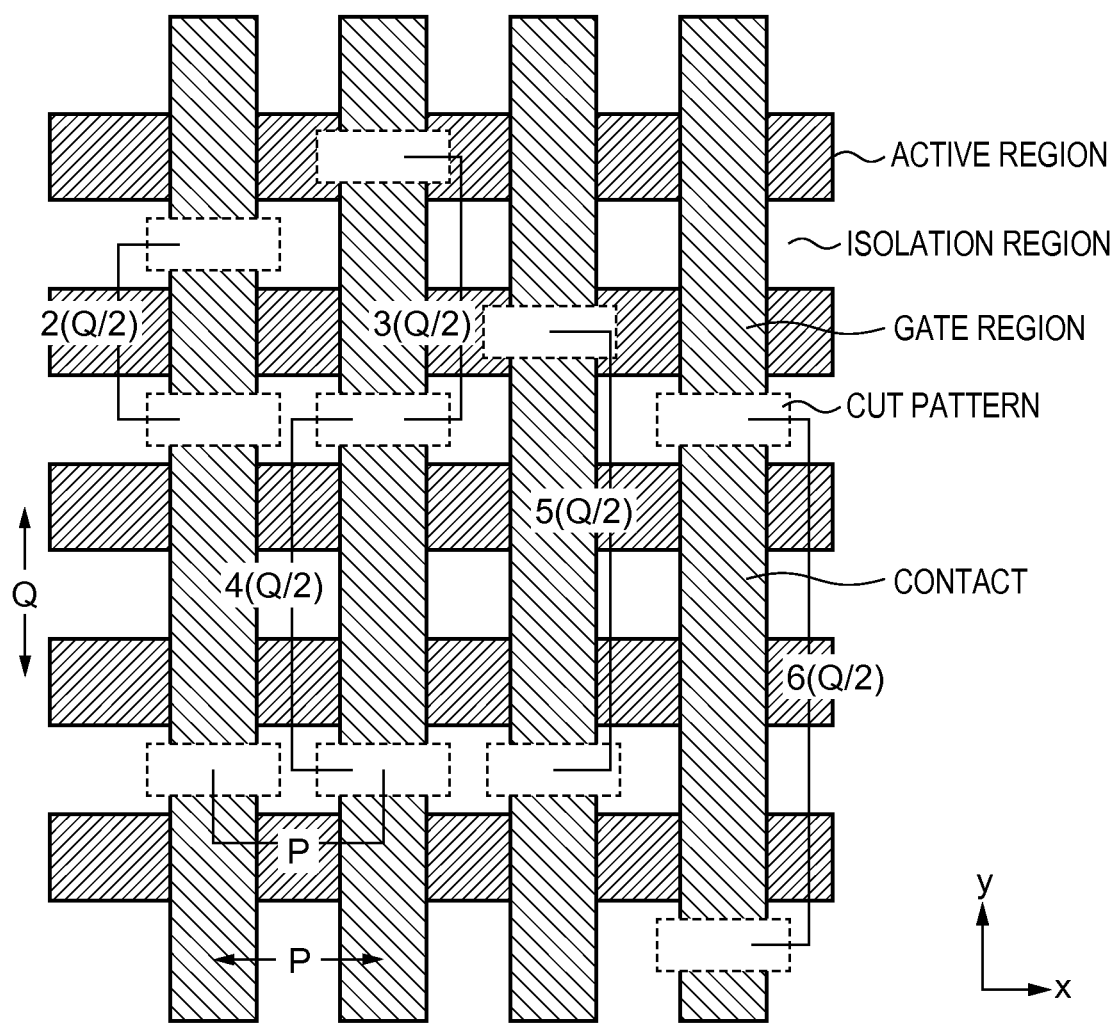
FIG. 7 is a view for explaining the layout of cut patterns in gate regions in a 1D layout.
Figure 10:
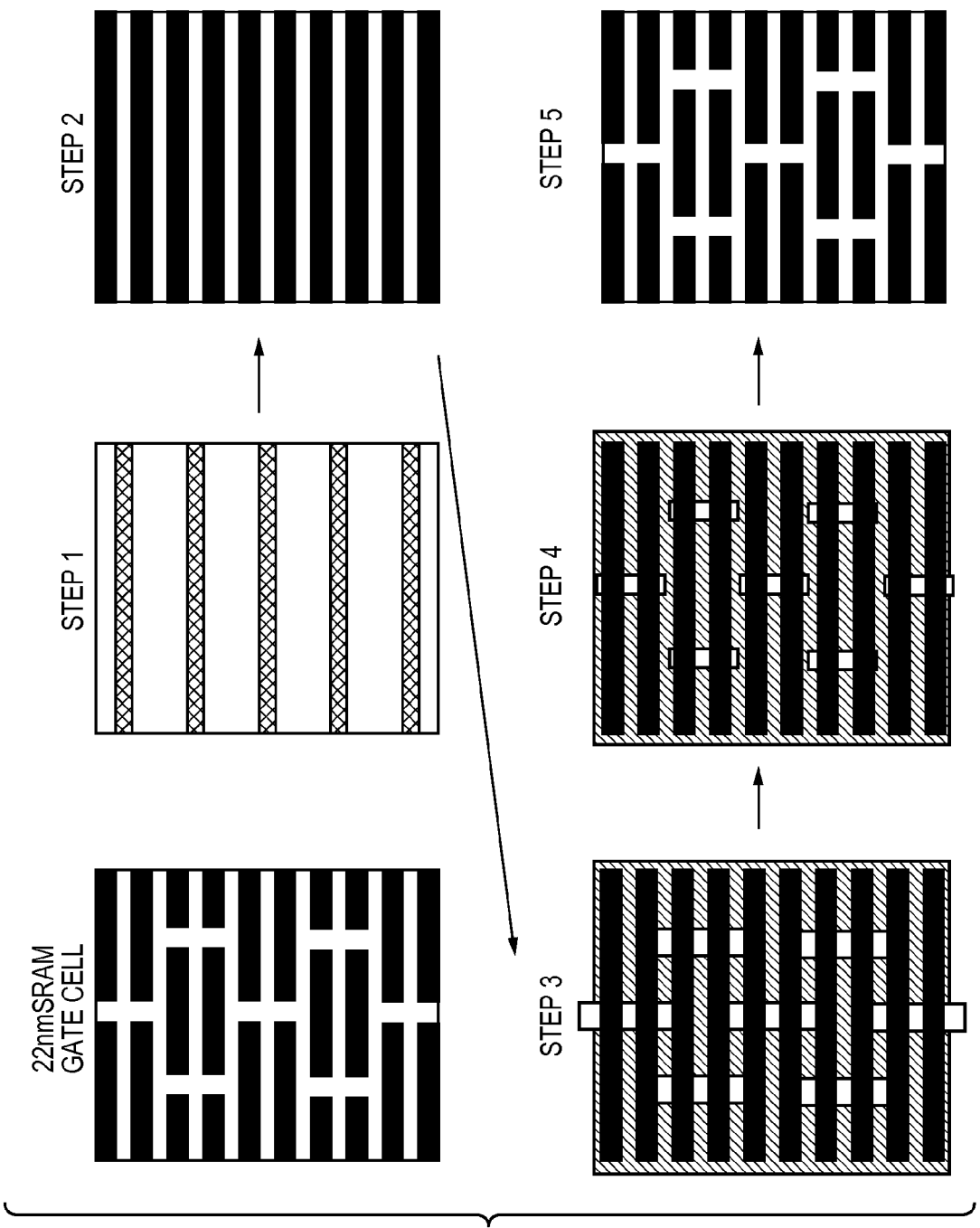
FIG. 10 shows views of a method of manufacturing a 1D layout.

A 1D layout to be achieved by the present invention will be described with reference to FIG. 7. Referring to FIG. 7, a plurality of linear patterns (line figures) are arranged as gate regions to extend in the Y-direction and align themselves at a predetermined pitch P in the X-direction. The linear patterns serving as gate regions are formed on the linear patterns in a plurality of isolation regions (and active regions) arranged to extend in the X-direction and align themselves at a predetermined pitch Q in the Y-direction. The drawing apparatus draws cut patterns (square figures) on the plurality of linear patterns in the gate regions. In the first embodiment, the Y-direction serves as a first direction, the X-direction serves as a second direction perpendicular to the first direction, and a linear pattern in the isolation region (and active region) serves as a second linear pattern.

In the first embodiment, the regularity of the layout of cut patterns in the gate regions is limited as follows. Letting Ai be the interval in the X-direction between the centers of each pair of cut patterns adjacent to each other in the X-direction (i is a number which specifies the pair). Also, let Bi be the interval in the Y-direction between the centers of each pair of cut patterns adjacent to each other in the Y-direction (i is a number which specifies the pair). In the first embodiment, the intervals Ai and Bi between the centers of each pair of cut patterns in the X- and Y-directions, respectively, the pitch P between gate regions, and the pitch Q between isolation regions (and active regions) have relations:

$$X\text{-direction; } Ai = m_1 P \; (m_1 = 1, 2, 3, \ldots) \quad (1)$$

$$Y\text{-direction; } Bi = m_2 (Q/2) \; (m_2 = 1, 2, 3, \ldots) \quad (2)$$

Although the intervals Ai and Bi between the centers of each pair of cut patterns in the X- and Y-directions, respectively, are set to satisfy equations (1) and (2) in the first embodiment, they can be respectively set to satisfy:

$$X\text{-direction; } Ai = m_1 X \; (m_1 = 1, 2, 3, \ldots) \quad (3)$$

$$Y\text{-direction; } Bi = m_2 Y \; (m_2 = 1, 2, 3, \ldots) \quad (4)$$

where X is a dimension defined by the pitch P between gate regions, and is represented by, for example, $P/n_1$ ($n_1$ is a natural number). When X is $P/n_1$ ($n_1=1$), equation (3) is equal to equation (1). Also, Y is a dimension defined by the pitch Q between isolation regions (and active regions), and is represented by, for example, $(Q/2)/n_2$ ($n_2$ is a natural number). When Y is $(Q/2)/n_2$ ($n_2=1$), equation 4 is equal to equation (2).

As described in the Related Art, as long as conditions required in the device manufacture are satisfied, cut patterns can be arranged at arbitrary positions, so conditions presented in equations (1) to (4) are special conditions which are not indispensable in the device manufacture. Isolation regions may be cut in the same way as in the gate regions. However, isolation regions are located on the grid having the pitch Q at the positions at which the gate regions are cut.

If $m_2=3$, a minimum number of transistors including contact regions are formed. The contact regions are connected to metal regions to select any of these transistors. If $m_2=4$, transistors are formed on the two sides of each contact region. If $m_2=5$, two transistors are formed on one side of each contact region. If $m_2=6$, one transistor is formed on one of the two sides of each contact region, while two transistors are formed on the other side. This makes it possible to form various complex transistors. If $m_2=2$, there is nowhere to form contact regions, so no transistors can be formed, but this can be set to form a floating capacitance.

When the arrangement of cut patterns is limited to that shown in FIG. 7, the greatest common divisors X and Y of the intervals Ai and Bi between the centers of each pair of cut patterns in the X- and Y-directions, respectively, are X=P and Y=Q/2, and these values can be used to define a drawing grid. In the semiconductor manufacture, a corporate section which determines a device layout is normally different from a section which uses a charged particle beam drawing apparatus. If these two sections do not mutually exchange required information, the section which uses a charged particle beam drawing apparatus measures the pitch between respective patterns from the acquired layout data to obtain X and Y which satisfy the above-mentioned relations. To obtain the pitch between respective patterns, software called a design rule check program is commercially available. If these two sections mutually exchange required information, the section which determines a layout desirably provides a set of the above-mentioned information and layout data to the section which uses a charged particle beam drawing apparatus, so as to save labor.

In a 20-nm node device, P and Q are about 60 nm, so X=P=60 nm and Y=Q/2=30 nm. As in the conventional case, when the arrangement of cut patterns has no regularity, a drawing grid is defined using a value as small as about 1 to 2 nm to cope with all arrangements. When X and Y are used to define a drawing grid, they have values 10 times or more those when the arrangement of cut patterns has no regularity, thus improving the processing capacity of the drawing apparatus. If X and Y are used to define a drawing grid, although a maximum effect can be produced, charged particle beam drawing must be corrected in actual drawing. Hence, a grid fine to a certain degree is necessary, and a value of a fraction of a natural number can be used to define the above-mentioned grid. If, for example, $n_2=n_2=10$, X=6 nm and Y=3 nm, a grid having a size several times that of a grid having X and Y values of 1 to 2 nm when the arrangement of cut patterns has no regularity is obtained.

Figure 11:
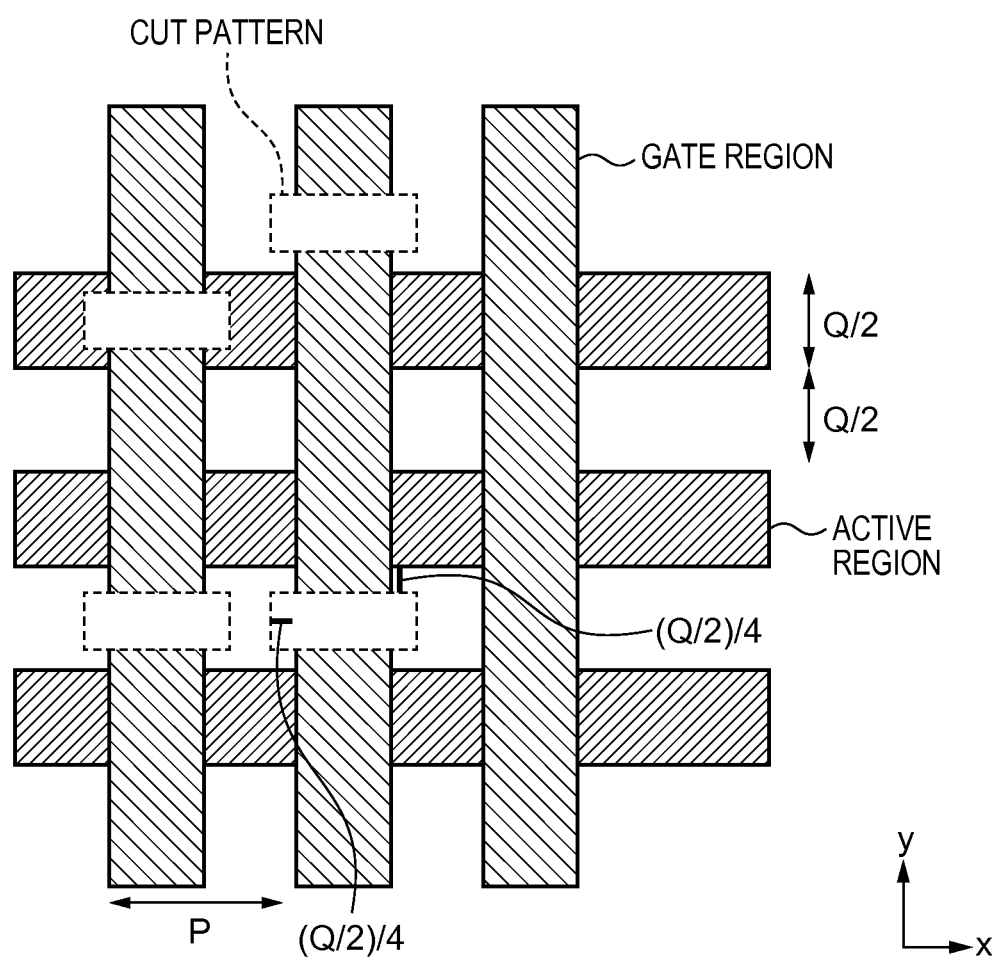
FIG. 11 is a view for explaining the sizes of cut patterns in a 1D layout according to the present invention.

The cut patterns have shapes which do not constitute a device, and are intended to cut a line-and-space pattern while satisfying the conditions described in the Related Art. Hence, the transfer position accuracy may be several times lower than that required in the conventional technique, so the drawing grid need not be set too fine. Although the size of the cut pattern does not directly influence the processing capacity, it must be determined to attain this technique, and a description thereof will be given with reference to FIG. 11.

Features in the Y-direction will be described first. If a margin of (Q/2)/4 must be left up to the isolation regions, the size of the cut pattern in the Y-direction is (Q/2)/2. Taking into account the sum Δ between the overlay accuracy and the size accuracy, Size of Cut Pattern in Y-direction≤(Q/2)/2−2Δ. The upper limit of this inequality is used because the transfer characteristics get better as the size of the cut pattern gets larger. Features in the X-direction will be described next. If a margin of (P/2)/4 must be left up to the gate end, the size of the cut pattern in the X-direction is "Gate Width"+(P/2)/2. Taking into account the sum Δ between the overlay accuracy and the size accuracy, Size of Cut Pattern in X-direction is "Gate Width"+(P/2)/2+2Δ. Although adjacent cut patterns may be connected to each other, each cut pattern must not come into contact with an adjacent gate region if cut patterns are not adjacent to each other, so Size of Cut Pattern in X-direction 3(P/2)−2Δ. Although individual cut patterns may have different sizes, they can have the same size in terms of reducing drawing data and simplifying the apertures of the drawing apparatus.

FIG. 8 shows the result of a comparison in throughput between the use of the conventional drawing grid and the use of a coarse drawing grid based on the interval between cut patterns according to the present invention in a multi-charged particle beam drawing apparatus for cut patterns of a 1D layout as described above. The conditions in which, for example, the required luminance of the electron source is 2.5E5 [$A/sr/cm^2$], and the resist sensitivity is 20 $\mu C/cm^2$ are used. When the number of electron beams remains the same, and the size of one grid is increased to twice, the throughput becomes twice or more. When the number of electron beams is decreased to reduce the apparatus load while the throughput remains the same, the required transfer rate halves. In this manner, a great improvement effect can be produced only by using a grid twice coarser than the conventional grid.

Second Embodiment

The second embodiment in which metal regions are determined in a 1D layout to be achieved by the present invention will be described with reference to FIG. 12. The layout of metal regions is determined by underlying contact regions, and via regions formed in the next step, but minute portions are determined by the contact regions. Also, although the contact regions are connected to lower regions including isolation regions and gate regions, those on the gate regions will be described as a representative herein. Line-and-space patterns are formed in the gate regions to extend in the Y-direction and align themselves at a pitch Q in the X-direction, while line-and-space patterns are formed in the metal regions to extend in the X-direction and align themselves at a pitch P in the Y-direction. In the second embodiment, metal regions have linear patterns which are arranged to extend in the X-direction as a first direction and align themselves at the pitch P in the Y-direction (second direction), and onto which cut patterns are to be drawn. Also, gate regions have second linear patterns arranged to extend in the X-direction as a second direction and align themselves at the pitch Q in the X-direction (first direction).

In the second embodiment, intervals Ai and Bi between the centers of cut patterns which form metal regions in the X- and Y-directions, respectively, are limited as follows:

Y-direction; Ai=$m_1$(P) (FIG. 12 illustrates an example of $m_1$=1)

X-direction; Bi=$m_2$(Q/2) (FIG. 12 illustrates an example of $m_2$=2, 3, 4, and 5)

In the device manufacture, the metal regions must satisfy the condition in which the patterns of cut metal regions cover underlying contact regions within the range of a margin, and vias connected from above are formed on the patterns of the metal regions within the range of a margin. As long as the above-mentioned condition is satisfied, the limits of the intervals Ai and Bi are special conditions which are not indispensable in the device manufacture.

Figure 12:
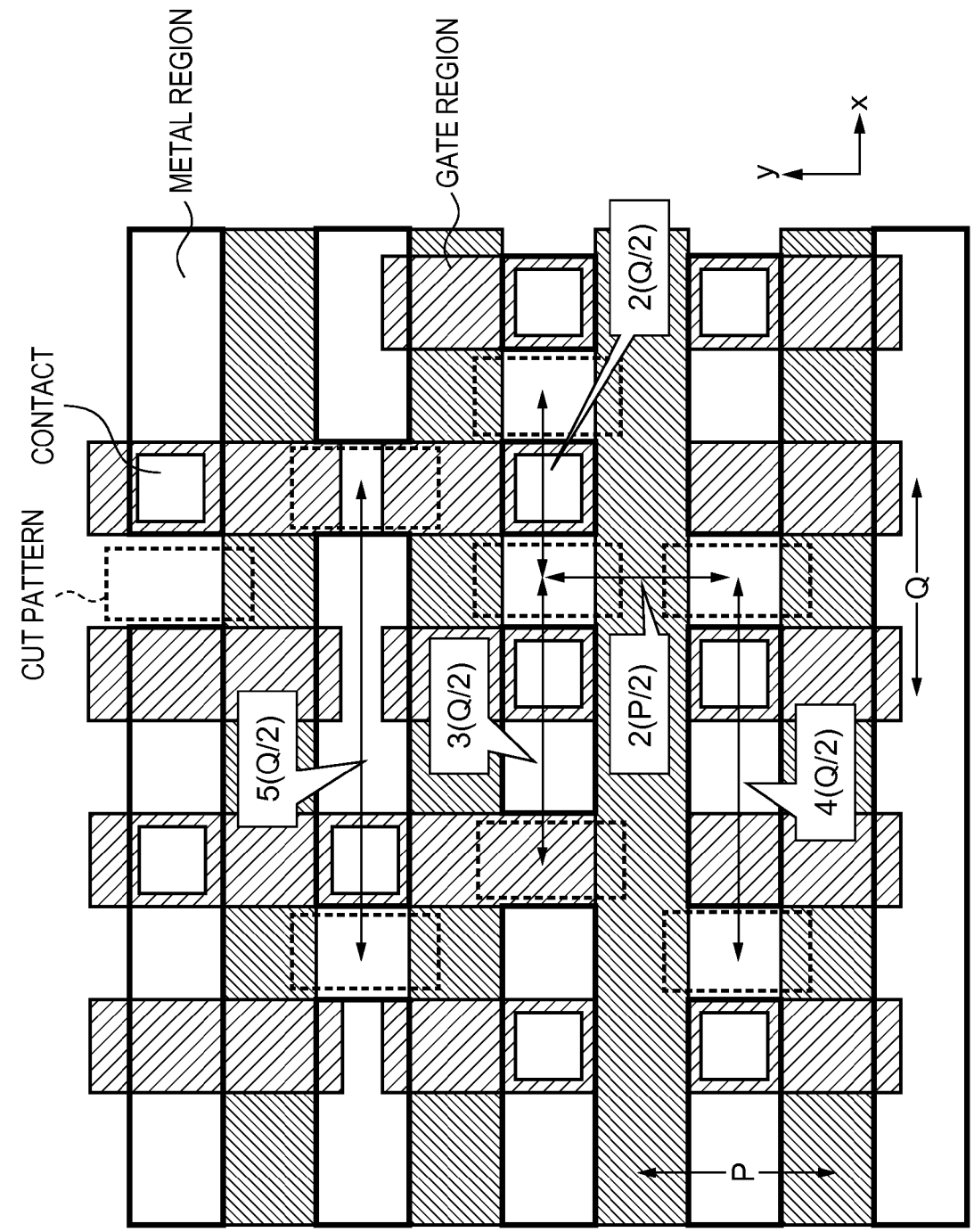
FIG. 12 is a view for explaining the layout of cut patterns in metal regions in a 1D layout according to the present invention.

When the arrangement of cut patterns is limited to that shown in FIG. 12, the greatest common divisors X and Y of the intervals Ai and Bi between the centers of cut patterns in the X- and Y-directions, respectively, are X=Q/2 and Y=P, and these values can be used to define a drawing grid. The effect of using a coarser grid is the same as in the first embodiment.

[Method of Manufacturing Article]

A method of manufacturing an article according to an embodiment of the present invention is suitable for manufacturing various articles including a microdevice such as a semiconductor device and an element having a microstructure. This method can include a step of forming a latent image pattern on a photosensitive agent, applied on a substrate, using the above-mentioned drawing apparatus (a step of performing drawing on a substrate), and a step of developing the substrate having the latent image pattern formed on it in the forming step. This method can also include subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

Although embodiments of the invention made by the inventor have been described above, the present invention is not limited to these embodiments, and various changes can be made without departing from the scope of this invention, as a matter of course. For example, although an electron beam is used in the above-mentioned embodiments, the present invention is not limited to this, and is applicable to, for example, other charged particle beams.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-018634 filed Jan. 31, 2012, which is hereby incorporated by reference herein in its entirety.

What is claimed is:

1. A method of determining a layout of a plurality of cut patterns used for a drawing method of drawing the plurality of cut patterns based on the determined layout using a charged particle beam drawing apparatus, the determining method comprising the steps of:

determining a layout of the plurality of cut patterns based on a plurality of first linear patterns arranged to extend in a first direction and aligned at a predetermined pitch P in a second direction perpendicular to the first direction so that the plurality of cut patterns satisfy Ai =$m_1$X ($m_1$=1, 2, 3, . . . ), wherein the plurality of cut patterns include plural pairs each having cut patterns adjacent to each other in the second direction, wherein Ai is an interval in the second direction between the centers of each pair i of cut patterns adjacent to each other in the second direction, i is a number that identifies the pair, and X is a dimension defined by the pitch P, and wherein the interval of one pair, among the plural pairs, in the second direction, is different from the interval of another pair, among the plural pairs, in the second direction, wherein the drawing method comprises a step of drawing the plurality of cut patterns on the plurality of first linear patterns based on the determined layout using the charged particle beam drawing apparatus.

2. The method according to claim 1, wherein the dimension X is represented by P/$n_1$, where $n_1$ is a natural number.

3. The method according to claim 1, wherein:

the plurality of first linear patterns are formed on a plurality of second linear patterns arranged to extend in the second direction and align themselves at a predetermined pitch Q in the first direction, and the plurality of cut patterns are determined so that an interval Bi in the first direction between the centers of each pair of cut patterns adjacent to each other in the first direction satisfies a relation:

Bi =$m_2$Y ($m_2$=1, 2, 3, . . . ), where Y is a dimension defined by the pitch Q, and wherein the interval of one pair, among the plural pairs, in the first direction is different from the interval of another pair, among the plural pairs, in the first direction.

4. The method according to claim 3, wherein the dimension Y is represented by (Q/2)/$n_2$, where n2 is a natural number.

5. The method according to claim 3, wherein the plurality of first linear patterns include gate regions, and the plurality of second linear patterns include one of isolation regions or active regions.

6. The method according to claim 3, wherein the plurality of first linear patterns include metal regions, and the plurality of second linear patterns include gate regions.

7. A method of manufacturing an article, the method comprising the steps of:

determining a layout of a plurality of cut patterns based on a plurality of first linear patterns arranged to extend in a first direction and aligned at a predetermined pitch P in a second direction perpendicular to the first direction so that the plurality of cut patterns satisfy Ai $m_1$X ($m_1$=1, 2, 3, . . . );

drawing the plurality of cut patterns on the plurality of first linear patterns based on the determined layout using a charged particle beam drawing apparatus;

developing the substrate having the plurality of cut patterns drawn thereon; and processing the developed substrate to manufacture the article, wherein the plurality of cut patterns include plural pairs each having cut patterns adjacent to each other in the second direction, wherein Ai is an interval in the second direction between the centers of each pair i of cut patterns adjacent to each other in the second direction, i is a number that identifies the pair, and X is a dimension defined by the pitch P, and wherein the interval of one pair, among the plural pairs, in the second direction, is different from the interval of another pair, among the plural pairs, in the second direction.

8. The method according to claim 2 wherein the X dimension is the pitch P.

* * * * *